United States Patent
Kinoshita

(10) Patent No.: US 6,294,743 B1
(45) Date of Patent: *Sep. 25, 2001

(54) MULTILAYER PRINT CIRCUIT BOARD AND THE PRODUCTION METHOD OF THE MULTILAYER PRINT CIRCUIT BOARD

(75) Inventor: Tohru Kinoshita, Fujisawa (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/413,147

(22) Filed: Oct. 6, 1999

Related U.S. Application Data

(62) Division of application No. 08/636,959, filed on Oct. 3, 2000, now Pat. No. 6,127,633.

(30) Foreign Application Priority Data

Apr. 28, 1995 (JP) .................................... 7-129535

(51) Int. Cl.$^7$ ................ H05K 1/02; H05K 1/11; H01R 12/04
(52) U.S. Cl. ............ 174/261; 174/255; 174/259; 174/261; 361/739; 361/792; 428/901
(58) Field of Search ................ 174/261, 262, 174/266, 250, 258, 259, 255; 361/792, 739, 757; 29/830, 852; 428/612, 131, 137, 607, 626, 901

(56) References Cited

U.S. PATENT DOCUMENTS

| | | | |
|---|---|---|---|
| 5,055,321 | * 10/1991 | Enomoto et al. | 427/98 |
| 5,130,179 | * 7/1992 | Miyazaki et al. | 428/209 |
| 5,434,751 | * 7/1995 | Cole, Jr. et al. | 361/792 |
| 5,517,758 | * 5/1996 | Nakamura | 29/852 |
| 5,590,461 | * 1/1997 | Ishida | 29/830 |
| 5,652,055 | * 7/1997 | King et al. | 428/343 |
| 6,127,633 | * 10/2000 | Kinoshita | 174/259 |

* cited by examiner

Primary Examiner—Jeffrey Gaffin
Assistant Examiner—I B Patel
(74) Attorney, Agent, or Firm—Anderson, Kill & Olick, P.C.

(57) ABSTRACT

The present invention provides a multilayer print circuit board having at least an inner print circuit pattern and an outer print circuit pattern which are laminated on a substrate through an insulation layer and being electrically connected to each other through a blind hole provided in the insulation layer. The insulation layer is composed of a resin insoluble in an oxidization agent and inorganic powder dispersed in the resin. The inorganic powder is soluble in the oxidization agent. The surface of insulation layer and the wall of the blind hole are roughed by the oxidization agent before the outer print circuit pattern is formed on the surface of the insulation layer by plating, whereby the inorganic powder exposed to the oxidization agent is melted therein, resulting in the roughed surface of the insulation layer and the wall of the blind hole.

7 Claims, 5 Drawing Sheets

MULTILAYER PRINT CIRCUIT BOARD AND THE PRODUCTION METHOD OF THE MULTILAYER PRINT CIRCUIT BOARD

This is a second divisional application of U.S. patent application Ser. No. 08/636,959. Now patented U.S. Pat. No. 6,127,633.

BACKGROUND OF THE INVENTION

1. Field of the Invention

This invention relates to improvements of print circuit boards and the production method thereof, and, in particular, relates to a multilayer print circuit board oooio having a laminated structure, wherein at least an inner print circuit pattern and an outer print circuit pattern for mounting surface mount devices are laminated on a substrate being insulated by an insulation layer interposed there-between, and are electrically connected to each other through a blind hole provided in the insulation layer.

2. Description of the Related Arts

Recently, multilayer print circuit boards used for various kinds of electronic products have been developed as the technology of high density electric circuit construction is advanced. The multilayer print circuit boards have a plurality of electrically conductive printed circuit patterns being electrically insulated by insulation layers each interposed between the neighboring printed circuit patterns.

As an example of the production method in these kinds of multilayer print circuit boards, there is disclosed a production method in the Japanese Patent Publication H5-37360/1993, wherein an inner print circuit pattern is provided on a surface of a substrate overlaid by an insulation layer on which an outer print circuit pattern is further provided, and the inner and outer circuit patterns are electrically connected to each other through a blind hole provided in the insulation layer.

FIG. 1 is a sectional view showing a multilayer print circuit board in the prior art.

A brief description is given of a multilayer print circuit board 100 in the prior art (the Japanese Patent Publication H5-37360/1993) in reference with FIG. 1.

After grinding a surface of a substrate 101, an inner print circuit pattern (referred to as an inner circuit pattern) 102 is formed on the surface thereof. Then, a surface of the inner circuit pattern is grained by using a copper surface oxidization agent. An insulation layer 103 and a bond layer 104 having a thickness of 2 to 3 $\mu$m provided for an electroless plating are respectively laminated on the inner circuit pattern 102 by coating and heat curing in the order.

After an electroless plating resist layer 105 has been formed on a surface of the cured bond layer 104 by screen-printing an ink pattern as a plating resist, it is cured by heat. Blind hole 106 for electrically connecting inner and outer circuit patterns is formed by using a carbonic acid gas laser, and a through hole 107 adjacent to the blind hole 106 by drilling.

After that, in order to enhance adhesion in the electro-less plating and as a smea treatment to a wall surface of the through hole 107 for removing a fused layer formed therein, a chemical roughing treatment is given to the insulation layer 103 exposed to the air, the bond layer 104 for electroless plating and an insulation material portion of the substrate 101 by using a solution of dichromic acid/sulfuric acid/sodium fluoride. Next, an outer circuit pattern 108 is formed on the insulation layer 103 by the electroless plating.

At that time, conductive layers are also formed on the surfaces of the blind hole 106 and the through hole 107 thereby, wherein a land 109 is also formed for connecting the inner circuit pattern 102 to the through hole 107.

According to the production method of the multilayer print circuit board 100 in the prior art, both the inner circuit pattern 102 and the outer circuit pattern 108 can be electrically connected through the land 109 formed on the surface of the blind hole 106. However, in the prior art the solution of dichromic acid/sulfuric acid/sodium fluoride is used for the chemical roughing treatment to enhance adherence of electroless plating as mentioned in the foregoing. This causes serious problems in view of the environmental protection as follows.

(a) Dichromic acid (chromium (VI)) is designated as an harmful material under the water-pollution preventing law, and there are some regions where the use of dichromic acid is prohibited.

(b) The system for removing the chromium (VI) contained in wastewater is complicated, and there enforced a severe disposal standard of not more than 0.5 mg/l under the water-pollution preventing law.

(c) The handling of polluted mud containing the chromium (VI) is very difficult, and further a severer restriction law is anticipated in future.

On the other hand, when fluoride such as sodium fluoride is used, the system for removing the fluoride contained in wastewater becomes complicated, resulting in high running cost.

Accordingly, upon performing the chemical roughing treatment on the insulation layers formed on the substrate, there are desired a multilayer print circuit board and the production method thereof capable of readily forming the blind hole for electrically connecting the inner and outer circuit patterns from the outer surface of the insulation layer without using harmful materials.

On the other hand, in apparatuses employing digital circuits such as communication apparatuses and digital computers, there arises a problem that noises generated by these apparatuses give interferences to other peripheral devices and apparatuses. As the countermeasure for suppressing the noises, there has been increased a demand for providing a signal carrying pattern being underneath a power source circuit layer and/or a ground circuit layer for better shielding effect because they are made of metal layers, however, it is not an easy task. Contrary to the demand, surface mount devices such as a QFP (Quad Flat Package), a board-to-board wiring (a connector) and a bare-chip need to be mounted on lands of the outer circuit pattern at a fine space interval of 0.3 to 0.4 mm. In this case, the connection method between the outer circuit pattern having lands and the inner circuit patterns including the signal carrying pattern, the power source circuit pattern and the ground circuit pattern is a very important to design the multilayer print circuit board in view of the high parts mounting density and cost reduction thereof.

SUMMARY OF THE INVENTION

Accordingly, a general object of the present invention is to provide the multilayer print circuit board and the production method thereof in which the disadvantages mentioned in the foregoing Description of the Related Art have been eliminated.

A more specific object of the present invention is to provide a multilayer print circuit board comprising: an substrate being electrically insulative; a first circuit pattern provided on at least one of the surfaces of the substrate; an insulation layer provided on the substrate to overlay the first circuit pattern, the insulation layer comprising a resin insoluble in an oxidization agent and calcium carbonate powder soluble in an oxidization agent, the calcium carbonate powder being dispersed in the resin, an inner surface of the first insulation layer being roughed by the oxidization agent; a blind hole provided in the insulation layer so as to reach the first circuit pattern for exposing a surface of the first circuit pattern, an inner wall of the first hole being roughed by the oxidization agent; and a second circuit pattern provided on the insulation layer and on the inner wall of the blind hole so as to electrically connect the first circuit pattern to the second circuit pattern through the blind hole.

A further and more specific object of the present invention is to provide a production method of a multilayer print circuit board,comprising the steps of: forming a first conductive layer on at least one of surfaces of a substrate being electrically insulative; forming a first circuit pattern by etching the first conductive layer; forming an insulation layer on the substrate so as to overlay the first circuit pattern, the insulation layer comprising a resin insoluble in an oxidization agent and calcium carbonate powder dispersed in the insulation layer, the calcium carbonate powder being soluble in the oxidization agent; forming a blind hole in the insulation layer so as to reach the first circuit pattern for exposing a surface thereof by irradiating a laser beam from an outside of the insulation layer; roughing a surface of the insulation layer and a wall surface of the blind hole by using the oxidization agent; forming a second conductive layer on the roughed surfaces of the insulation layer and the wall surface of the blind hole; and forming a second circuit pattern by etching the second conductive layer.

A further and more specific object of the present invention is to provide a production method of a multilayer print circuit board, comprising the steps of: forming a first conductive layer on at least one of surfaces of a substrate being electrically insulative; forming a first circuit pattern by etching the first conductive layer; forming an inner insulation layer on the substrate to overlay the first circuit pattern, the first insulation layer comprising a resin insoluble in an oxidization agent and $SiO_2$ powder dispersed in the resin; forming an outer insulation layer on the inner insulation layer, the outer insulation layer comprising a resin insoluble in an oxidization agent and calcium carbonate powder dispersed in the outer insulation layer, the calcium carbonate powder being soluble in the oxidization agent; forming a blind hole in the inner and outer insulation layers so as to reach the first circuit pattern for exposing a surface thereof by irradiating a laser beam from an outside of the outer insulation layer; roughing a surface of the outer insulation layer and a wall surface of the blind hole by using the oxidization agent; forming a second conductive layer on the roughed surfaces of the outer insulation layer and the wall surface of the blind hole; and forming a second circuit pattern by etching the second conductive layer.

Other objects and further features of the present invention will be apparent from the following detailed description.

DETAILED DESCRIPTION OF THE PREFERRED EMBODIMENTS

[A First Embodiment]

A detailed description is given of a first embodiment of a multilayer print circuit board along with a production method thereof, referring to FIG. 2 and FIGS. 3(A) through 3(F) along with Tables 1 to 2.

Figure 1:
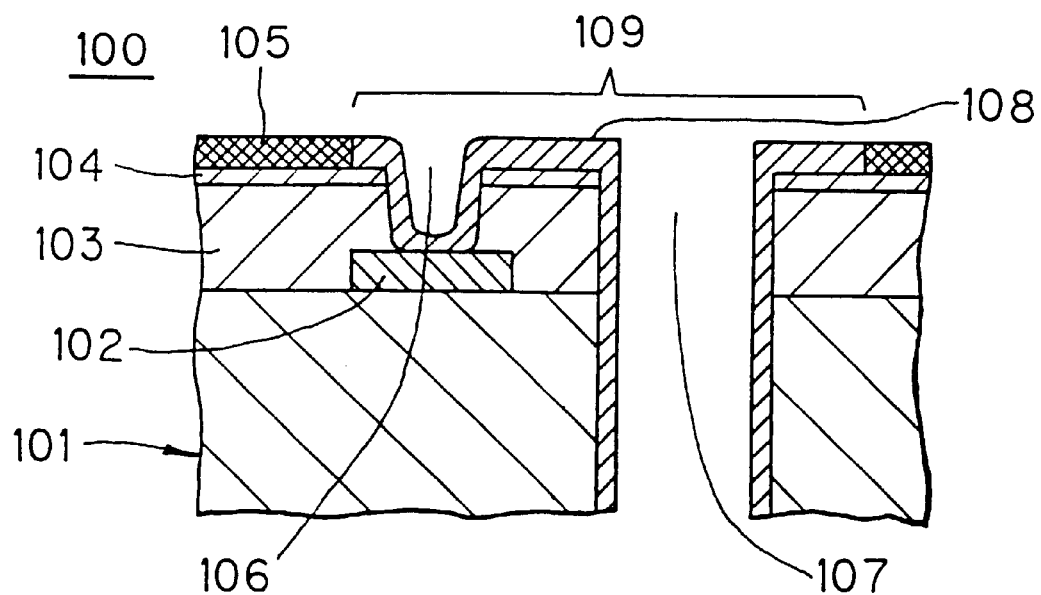
FIG. 1 is a sectional view showing a multilayer print circuit board in the prior art.
Figure 2:
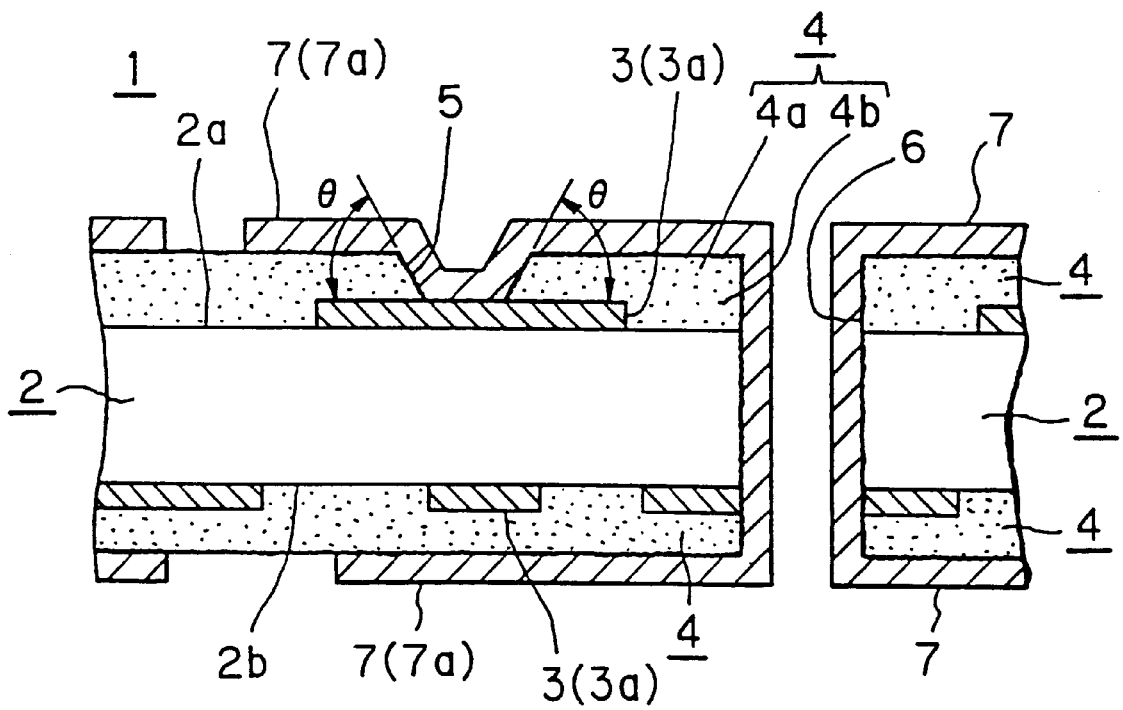
FIG. 2 is a sectional view of a multilayer print circuit board of the present invention.

FIG. 2 is a sectional view of a multilayer print circuit board of the present invention, and FIGS. 3(A) through 3(F) are sectional views for explaining the production process of the present invention.

Figure 3A:
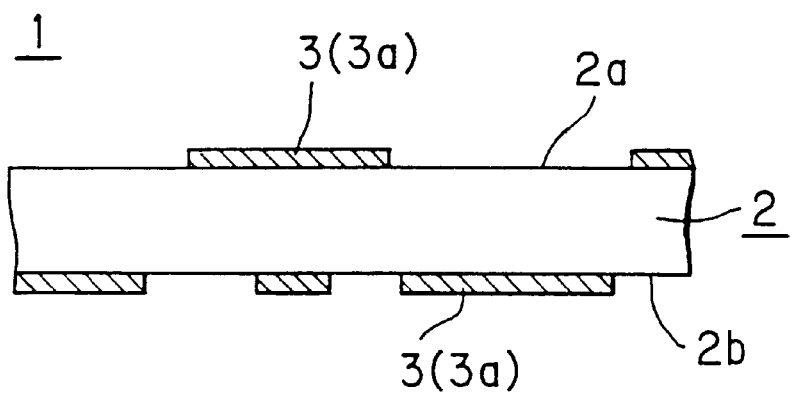
FIGS. 3(A) through 3(F) are sectional views for explaining a production process of the present invention.

As shown in FIGS. 2 and 3(A), in the multilayer print circuit board 1 (referred to as a multilayer circuit board) of the present invention, an insulation substrate 2 having a flat shape is used as a support base. The insulation substrate is made of epoxy resin or glass fiber enhanced epoxy resin and inner circuit patterns 3, 3 are provided on both an upper surface 2a and a bottom surface 2b of the insulation substrate 2 by causing inner conductive layers 3a, 3a to be etched. The method to form the inner circuit patterns on the upper and bottom surfaces of the insulation substrate 2 is well known.

Specifically, dry films are formed on the inner conductive layers 3a, 3a made of copper foils laminated on both the upper surface 2a and the bottom surface 2b of the insulation substrate 2. After the dry films are exposed to an ultraviolet ray through a photomask and are developed by using a water solution of 1% sodium carbonate, they are etched by using a water solution of cupric chloride. The dry films are removed, resulting in the inner circuit patterns 3, 3.

Figure 3B:
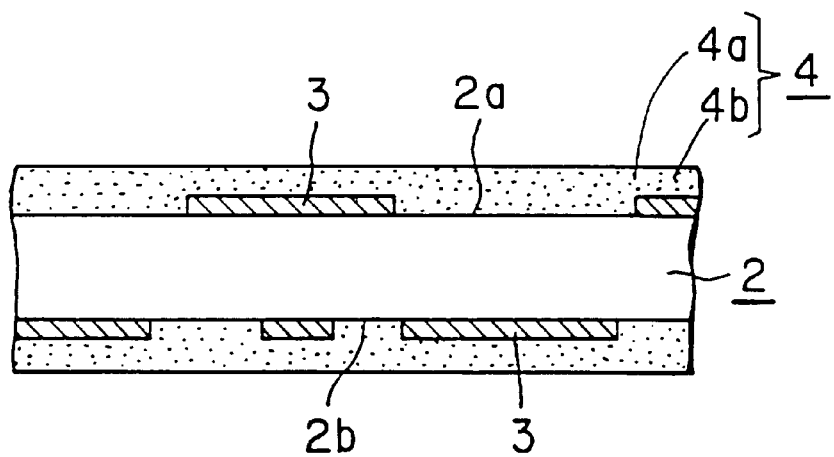

Next, as shown in FIGS. 2 and 3(B), on the inner circuit patterns 3, 3 provided on the upper and bottom surfaces 2a, 2b of the insulation substrate 2, insulation layers 4, 4 are respectively provided thereon by coating. These insulation layers 4, 4 are mainly made of a liquid resin 4a (before cured) in which an inorganic powder (calcium carbonate) is dispersed. The liquid resin 4a is insoluble in an oxidizing agent but the inorganic powder is soluble in the oxidizing agent. The liquid resin 4a may contain a stress cushioning agent for lessening an impact of machining and a small amount of other additives.

The above insulation layer 4 is a main structural component of the present invention. The material of the insulation layer 4 is selected as mentioned hereinafter so as to allow the use of such a harmless oxidizing agent as a permanganate upon performing the chemical roughing treatment before plating an outer conductive layer 7a on the insulation layer 4. The inorganic powder is dispersed in the insulation layer 4 so as to form grains on the surface of the insulation layer 4 by causing the inorganic powder exposed on the surface thereof to melt in the oxidizing agent when the surface roughing treatment is performed by using the oxidizing agent. The particle diameters of of the inorganic powder (calcium carbonate) are determined to be below 15 $\mu$m (an average diameter: 1 to 5 $\mu$m, preferably 2–4 $\mu$m) taking account of a predetermined surface roughness of the insulation layer 4 and of a laser machine. Further, a content rate of the inorganic powder is to be 15 to 35 weight parts.

Next, the detailed description is given of the above insulation layer 4. The insulation layer 4 is made of following materials.

(1) As the resin (liquid) 4a insoluble in the oxidizing agent, for instance,
   bisphenol A epoxy resin: 100 weight parts
   curing agent: 10 weight parts
(2) As the inorganic powder soluble in the oxidizing agent,
   calcium carbonate (average diameter 1–5 μm): 15 to 35 weight parts
(3) As the cushioning agent against the impact of machining,
   polybutadiene: 10 to 20 weight parts
(4) As other additives: few After these materials denoted by (1) to (4) are prepared and mixed to be dispersed adequately in a liquid state, the mixture is coated to a thickness of 50 to 100 μm on both the upper and bottom surfaces 2a, 2b of the insulation substrate 2 on which the inner circuit patterns 3, 3 are formed by a curtain coat method or a screen print method. After that, the coated layers thereof are cured at 150° C. in a furnace for 40 minutes by heating, resulting in the insulation layers 4, 4. In this embodiment, the thicknesses of the insulation layers 4, 4 are made approximately within 5 μm.

Figure 3C:
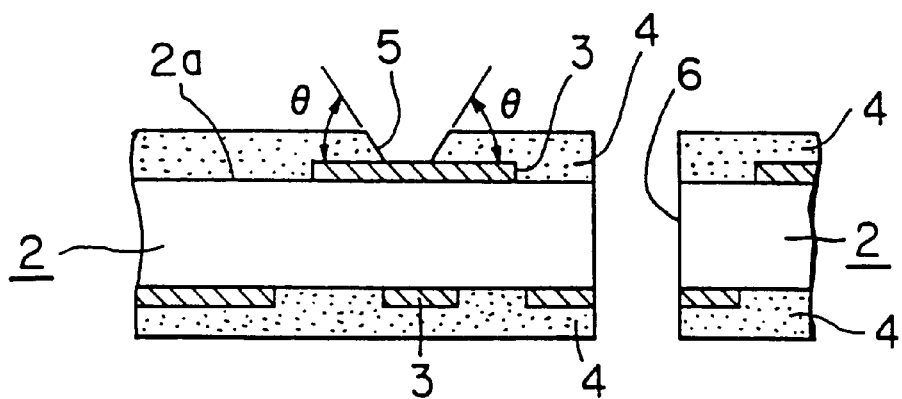

Next, as shown in FIGS. 2 and 3(C), a blind hole 5 for connecting the inner circuit pattern 3 and the outer circuit pattern 7 is formed in the insulation layer 4 so as to reach to the inner circuit pattern 3 by irradiating a laser beam from the upper side of the insulation layer 4, thus the inner circuit pattern 3 is exposed to an atmosphere. It is generally said that a laser beam is not optimum for providing holes in the inorganic material. However, in this embodiment, it is possible to form the blind hole 5 in the insulation layer 4 containing the calcium carbonate as the inorganic material by using a laser beam under a condition mentioned hereinafter, and by determing the content rate and the particle diameter of calcium carbonate powder contained in the insulation layer 4 as mentioned above.

The blind hole 5 has a V-letter tapered shape having an angle Θ of 20° to 90°, preferably 45° to 85° and most preferably 85°, to allow easy plating on the wall surface of the blind hole 5. This V-letter tapered shape is obtained by shifting the focus of the laser beam, and controlling the pulse width and pulse energy of the laser beam.

There are proposed various kinds of laser beams for machining the circuit boards.

Table 1 shows various kinds of the laser beams and the experimental results of the blind hole 5 provided on the insulation layer 4 by using the laser beams.

TABLE 1

| kinds of laser beams | *1 damage of inner patt. | *2 decompo. of insu. layer | *3 machin. accuracy | *4 machin. time |
|---|---|---|---|---|
| $CO_2$ laser | large | large | no good | |
| short pulse $CO_2$ laser | none | small | good | short |
| KrF excimer laser | none | small | good | long |
| YAG laser | large | large | no good | |

*1 damage of inner pattern; *2 decomposition of insulation layer; *3 machining accuracy; *4 machining time As shown in Table 1, the short pulse $CO_2$ and KrF laser beams are acceptable to be used, however, the short pulse $CO_2$ is more preferable from a practical point of view because of its availability and short machining time.

The advantage of the short pulse laser is that it is possible to add heat energy low enough to prevent the heat defor-mation of the insulation layer 4 without applying excessive heat energy. The pulse interval thereof is determined to be from 0.003 to 0.02 seconds.

As conceivable laser machining methods to provide the blind hole 5 having a tapered shape at a predetermined position on the surface side of the insulation layer 4, there are a conformal mask method, a mask imaging method, a contact mask method and a direct imaging method. However, the masking imaging method and the direct imaging method are preferable to machine the blind hole 5 having the tapered shape from the upper surface of the insulation layer 4.

Further, in order to electrically connect the outer circuit pattern 7 provided on the upper surface 2a side of the insulation substrate 2 as mentioned hereinafter, and the outer circuit pattern 7 provided on the bottom surface 2b side of the insulation substrate 2, a through hole 6 passing through the insulation layer 4 (outer), the insulation substrate 2 and the insulation layer 4 (inner) is formed by drilling.

Figure 3D:
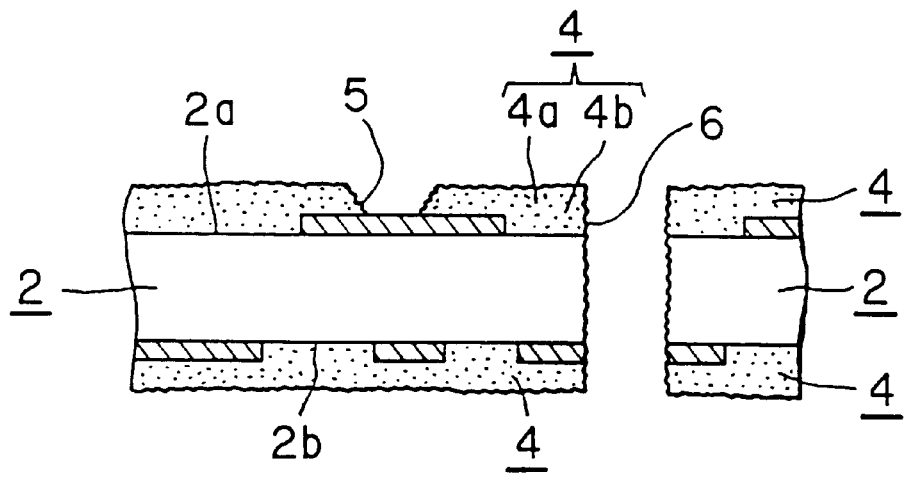

Next, as shown in FIGS. 2 and 3(D), after providing the blind hole 5 and the through hole 6, an oxidization treatment (chemical roughing treatment) is performed by using an oxidization agent mainly composed of potassium permanganate so as to rough the upper and bottom surfaces 2a, 2b of the insulation layer 2 and the wall surfaces of the blind hole 5 and the through hole 6.

The oxidization treatment is performed as follows:
(1) For a lubrication process, a water solution of caustic soda and solvent is used.
(2) For a roughing process, a water solution of potassium permanganate (permanganate) and caustic soda is used.
(3) For a acid pickling process, a water solution of sulfuric acid is used.

In particular, in the roughing process, only portions of the inorganic powder (calcium carbonate) 4b exposed to the water solution of potassium permanganate (permanganate) and caustic soda are readily melted into the water solution thereof because the inorganic powder (calcium carbonate) 4b which is soluble in the oxidization agent such as potassium permanganate (permanganate), is dispersed in the resin 4a which is insoluble to the oxidization agent, resulting in the roughed surfaces of the insulation layers 4, 4 and the roughed wall surfaces of the blind hole 5 and the through hole 6.

The potassium permanganate (permanganate) is a harmless oxidization agent different from such harmful ones as the dichromic acid and sodium fluoride as mentioned in the foregoing. Thus, there is no problem on the oxidization process (rouging process), and it is possible to employ a versatile processing system for that. Further, the running cost is decreased because of no environmental pollution problem and of requiring no much cost for wastewater disposal.

Figure 3E:
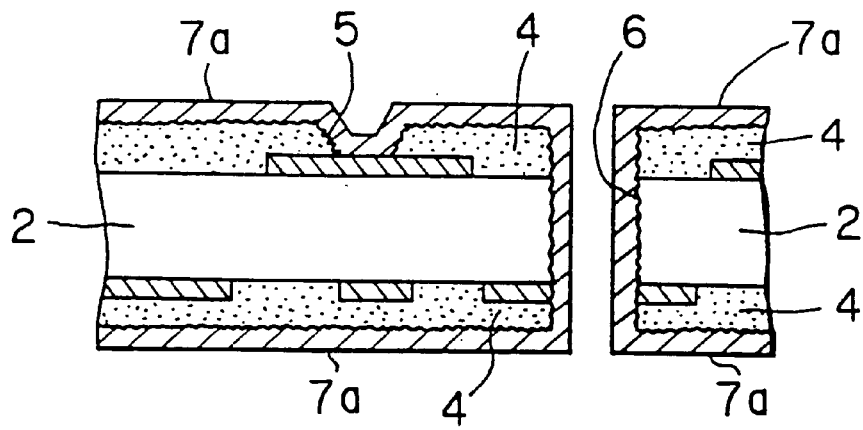

Next, as shown in FIGS. 2 and 3(E), the outer conductive layers 7a, 7b are laminated on the roughed surfaces of the insulation layers 4, 4, to form the outer circuit patterns 7, 7, together with conductive layers on the roughed inner walls of the blind hole 5 and the through hole 6, by both electroless copper plating and copper plating.

Figure 3F:
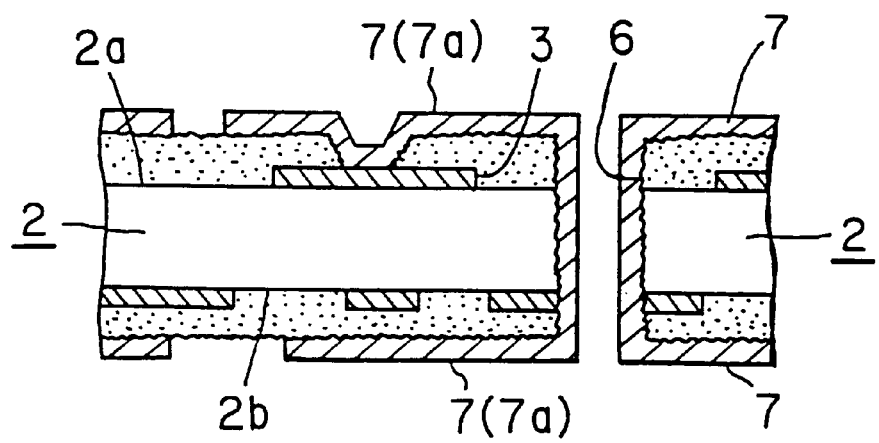

Next, as shown in FIGS. 2 and 3(F), the outer circuit patterns 7, 7 are formed on the both surfaces of the insulation layers 4, 4 by etching the outer conductive layers 7a, 7b, wherein the etching treatment is conducted in such a manner that the inner circuit pattern 3 formed on the upper surface 2a side of the insulation substrate 2 is electrically connected to the outer circuit pattern 7 formed on one of the insulation layer 4 through the conductive layer of the blind hole 5, and the outer circuit pattern 7 formed on the upper surface 2a side of the insulation substrate 2 is electrically connected to the outer circuit pattern 7 formed on the bottom surface 2b side of the insulation substrate 2 through the conductive layer of the through hole 6.

After that, electronic parts are mounted on the outer circuit patterns 7, 7.

Table 2 shows the evaluation results of the multilayer circuit board 1 of the present invention.

TABLE 2

| evaluation items | evaluation conditions | results |
| --- | --- | --- |
| peel strength of outer pattern | | not less than 14 N/cm |
| soldering heat proof test | 260° C. ± 5° C., 20 sec. | normal |
| thermal shock test | −60° C./30 min. 125° C./30 min. 100 cycles | normal |
| heat cyclic test | −60° C./30 min. 20° C./10 min. 125° C./30 min. 20° C./10 min. 100 cycles | normal |
| moisture withstanding test | 60° C., 90%, 240 hours | normal |
| hot oil test (silicon oil) | 260° C./10 sec. (*silicone) 20° C./10 sec. **(air) 0° C./10 sec. (in silicone) 20° C./10 sec. **(air) 100 cycles | normal |
| pressure cooker test + soldering heat proof test | (2 atms. 121° C., 100% mois. 1 hour) + (260° C. ± 5° C. 20 sec.) | normal |

*in silicone oil
**air transfer period

As seen from Table 2, the multilayer circuit board 1 of the present invention has such advantages as excellent soldering characteristics, and shows excellent results in both the electrical and mechanical characteristics under various kinds of elevated environmental tests.

Thus, it is possible to provide the multilayer circuit board 1 having a high parts mounting density, a high function, a high reliability and a high cost performance.

In the embodiment, the inner circuit patterns 3, 3 are provided on both the upper surface 2a and the bottom surface 2b of the insulation substrate 2, however, it is possible to provide only one of them either on the upper surface 2a or on the bottom surface 2a thereof, wherein the inner circuit pattern 3 formed on the insulation substrate 2 is electrically connected to the outer circuit pattern 7 through the blind hole 5 defined on the insulation layer 4.

[A Second Embodiment]

Figure 4:
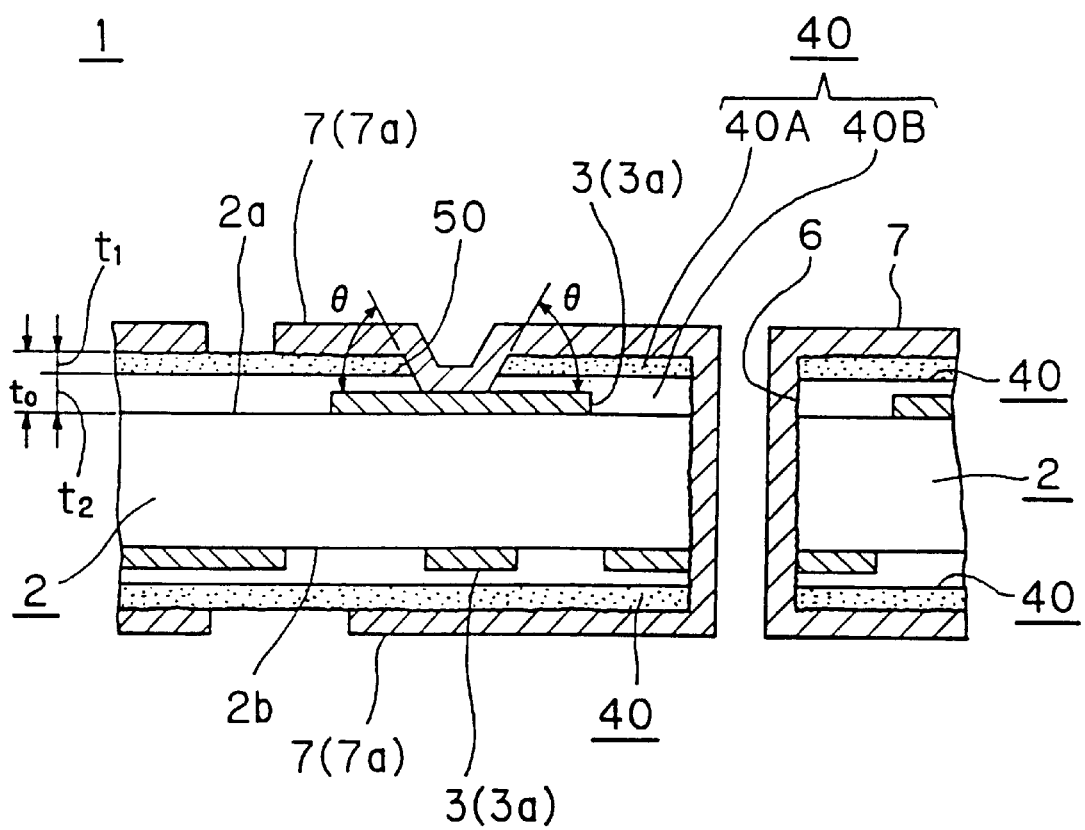
FIG. 4 is a sectional view showing a multilayer circuit board of a second embodiment of the present invention.

FIG. 4 is a sectional view showing a multilayer circuit board of a second embodiment of the present invention.

In this embodiment, an insulation layer 40 which is provided on the inner circuit patterns 3, 3 of the first embodiment and is corresponding to the insulation layer 4 thereof has a laminated structure of two kinds of insulation layers, i.e., an outer insulation layer 40A and an inner insulation layer 40B. The thickness of the insulation layer 40 is made to be about 75 μm.

Upon forming the insulation layer 40, at first, the inner insulation layer 40B is formed over the inner circuit pattern 3 by being coated and cured by heating, then the outer insulation layer 40A having the same composition as that of the insulation layer 4 is provided on the inner insulation layer 40B. The inner insulation layer 40B has a thickness of about 50 μm and contains $SiO_2$ powder instead of the calcium carbonate powder which is dispersed in the insulation layer 4 of the first embodiment, to improve a machining characteristic of the insulation layer 40 and to enhance a humidity resistance thereof. The inner insulation layer 40B has about 2/3 thickness of that of the insulation layer 40.

The inner insulation layer 40B is made of following materials.

(1) As the resin (liquid) insoluble in the oxidizing agent, for instance,
    bisphenol A epoxy resin: 100 weight parts
    curing agent: 10 weight parts
(2) As the cushioning agent against the impact of machining,
    $SiO_2$ (average particle diameter 1–3 μm): 10 to 30 weight parts
(3) As other additives: few After these materials denoted by (1) to (3) are prepared and mixed to be dispersed adequately in a liquid state, the mixture is coated by a curtain coat method or a screen print method on both the upper and bottom surfaces 2a, 2b of the insulation substrate 2 on which the inner circuit patterns 3, 3 are formed. After that, the coated layers thereof are cured at 150° C. in a furnace for 40 minutes by heating, resulting in the inner insulation layers 40B, 40B. Then, the outer insulation layer 40A having the same components as those of the insulation layer 4 is formed in the same manner as mentioned in the foregoing.

After that a blind hole 50 is formed so as to expose the inner circuit pattern 3 by irradiating the laser beam in the same manner as mentioned in the foregoing referring to FIG. 3(C). Upon providing the blind hole 50 by the laser beam, it is easier to form the blind hole 50 digging into the inner insulation layer 40B than digging into the outer insulation layer 40A because the particle diameter of $SiO_2$ (below 8 μm, average particle diameter; 1–3 μm) is smaller than that of the calcium carbonate powder, and the content rate of $SiO_2$ in the inner insulation layer 40B is smaller than that of the calcium carbonate contained in the outer insulation layer 40A.

In roughing process, the inner insulation layer 40B is also roughed to some degree by the solution of potassium permanganate, thus, the adverse effect does not arise in the subsequent process of forming the outer circuit pattern 7.

In addition, the outer circuit pattern 7 is adhered intimately to the outer insulation layer 40A which is adequately roughed, and is adhered intimately to the inner circuit pattern 3 in the blind hole 50. Thus, the adherence characteristic of the outer circuit pattern 7 is adequately secured.

Incidentally, the particle diameter of calcium carbonate powder dispersed in the outer insulation layer 40A is below 15 μm (average particle diameter: 1–5 μm, preferably 2–4 μm) as well as that of the first embodiment. The content rate of the calcium carbonate is limited to 15 to 35 weight parts to the resin of 100 weight parts. This effectively prevents a separation of the outer and inner insulation layers 40A, 40B by suppressing the infiltration of the treatment liquid of potassium permanganate.

[A Third Embodiment]

Figure 5:
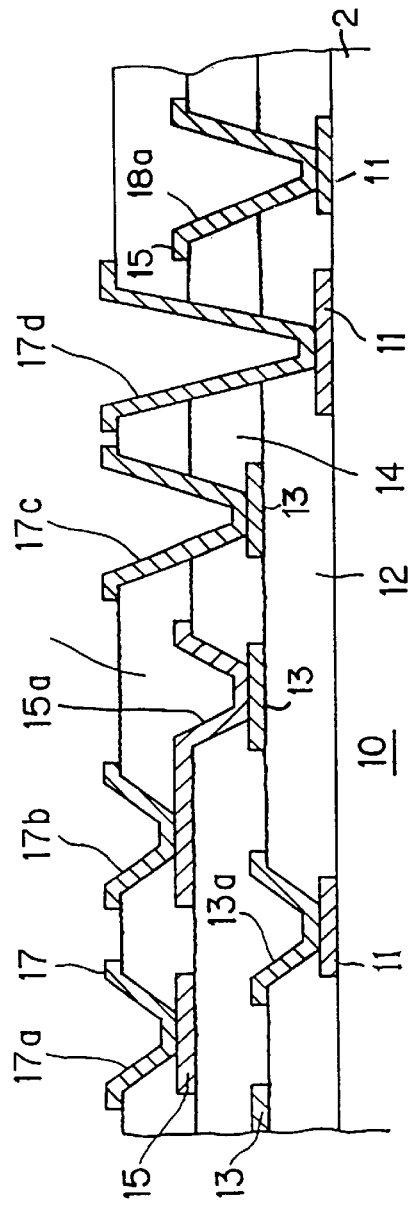
FIG. 5 is a sectional view showing one side of a multilayer circuit board of a third embodiment of the present invention.

FIG. 5 is a sectional view showing one side of a multilayer circuit board of the present invention.

In this embodiment, after forming four print circuit patterns (corresponding to the inner circuit patterns 3, 3 and the outer circuit patterns 7, 7 shown in FIG. 2) made of conductive layers on the upper and bottom surfaces of the insulation substrate 2 through the production processes shown with FIGS. 3(A) to 3(F), additional four print circuit patterns are formed thereon, resulting in eight layers of print circuit patterns.

Specifically, in the same manner as shown in FIGS. 3(A) to 3(F), after forming a first inner circuit pattern 11 on both the upper and bottom surfaces of a substrate 2 and a first insulation layer 12 having a thickness of 50–100 μm on the first inner circuit pattern 11 by coating and heat-curring, a blind hole 13a having a V-letter tapered shape is formed in the first insulation layer 12 so as to expose the first inner circuit pattern 11 by irradiating the laser beam. After the roughing treatment, a through hole (not shown) is formed at a desired position in the substrate 2. Thus, the blind hole 13a having a conductive layer is obtained by forming a second inner circuit pattern 13 on the first insulation layer 12.

In the same manner as mentioned above, there are formed a second insulation layer 14, a third inner circuit pattern 15, a third insulation layer 16 and an outer circuit pattern 17 are formed in this order, resulting in the multilayer circuit board 10 of the third embodiment. In the multilayer circuit board 10, the numeral characters 17a, 17b denote a blind hole for connecting the third inner circuit pattern 15 and the outer circuit pattern 17, and the blind hole 17b has an additional function to be electrically connected to a blind hole 15a which connects the second inner circuit pattern 13 to the third inner circuit pattern 15.

A blind hole 18a is constructed to enable the electrical connection of the third inner circuit pattern 15 to the first inner circuit pattern 11.

A blind hole 17c is constructed to enable the electrical connection of the outer circuit pattern 17 to the second inner circuit pattern 13, and a blind hole 17d is constructed to enable the electrical connection of the outer circuit pattern 17 to the first, second and third inner circuit pattern 11, 13 and 15. Needless to say, these inner and outer circuit patterns can optionally be connected to each other through the blind holes.

Upon forming blind holes (13a, 15a, 17a–17d, 18a) for electrically connecting the inner and outer circuit patterns (11, 13, 15 and 17) in a desired position, the laser beam is controlled as follows. The blind holes (13a, 15a, 17a–17d, 18a) for electrically connecting the adjacent circuit patterns may be formed on the insulation layers (12, 14, 16) so as to have a desired V-letter tapered shape by controlling the focus of the laser beam. The blind hole 17d for electrically connecting the outer circuit pattern 17 at the top and the first inner circuit pattern 11 at the bottom may be formed so as to have a desired V-letter tapered shape by controlling the energy density of the laser beam, wherein the outer and the inner circuit pattern are situated in the multi layer circuit board 10, the larger the diameter of the blind hole of the inner circuit pattern provided on such circuit pattern because the blind hole 17d has the V-letter tapered shape.

[A Fourth Embodiment]

Figure 6:
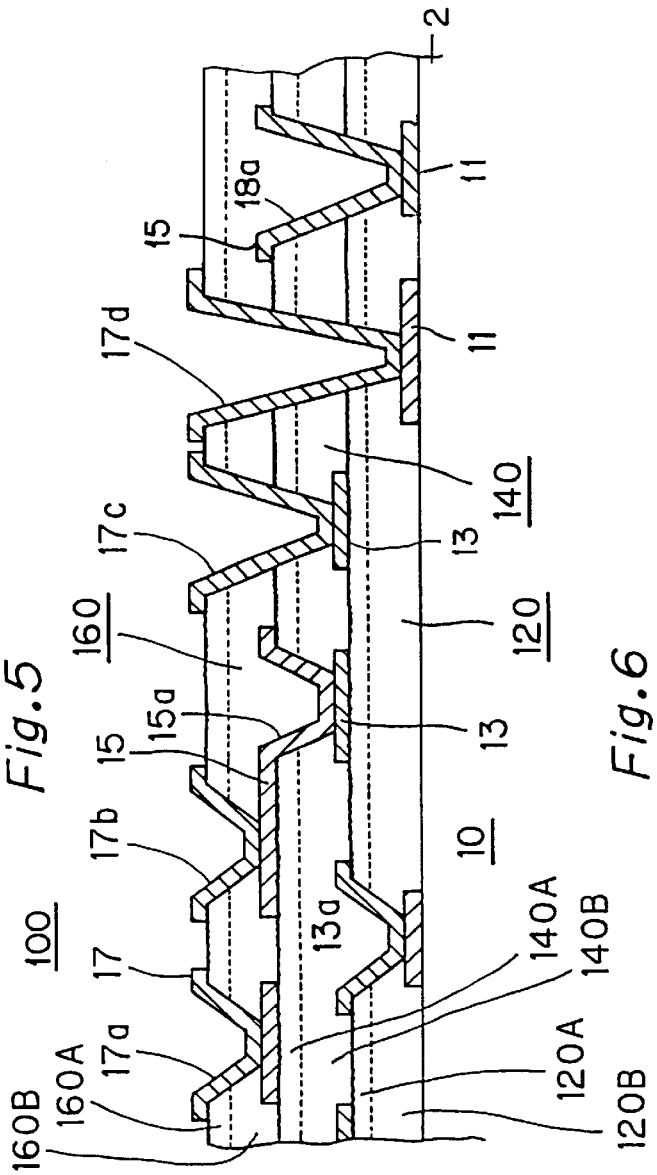
FIG. 6 is a sectional view showing a multilayer circuit board of a fourth embodiment of the present invention.

FIG. 6 is a sectional view showing a multilayer circuit board of a fourth embodiment of the present invention.

In this embodiment, a multilayer circuit board 100 has the same construction as that of the third embodiment except for substituting the insulation layers 12, 14, 16 for insulation layers {120 (120A, 120B), 140 (140A, 140), 160 (160A, 160B)}, wherein each of the insulation layers 120, 140, 160 employs a laminated structure of two kinds of insulation layers, i.e., the outer insulation layers (120A, 140A, 160A) and the inner insulation layers (120B, 140B, 160B) as mentioned in the second embodiment. The construction and the fabrication method and the merits thereof are the same as those of the second and third embodiments. Thus, detailed explanation is omitted here for simplicity.

According to the third and fourth embodiments of the present invention, it is possible to provide the signal carrying pattern below the power source pattern or the ground pattern readily, for instance, by determining the first inner circuit pattern as the signal carrying pattern and by selecting either the second inner circuit pattern (13) or the third inner circuit pattern (15) as the power source pattern or the ground pattern. This prevents interference generated from the signal carrying pattern from causing adverse effect to the peripheral devices.

In summary, according to the multilayer circuit board and the production method of the present invention, it is possible to provide the multilayer circuit board and the production method capable of roughing surfaces of the insulation layer and the inner walls of the blind hole and the through hole by using harmless oxidization agents without using such harmful materials as dichromic acid and sodium fluoride, thus, there is no problem on the oxidization process (roughing process), and it is possible to employ a versatile processing system for that, resulting in decrease of running cost because of no environmental pollution problem and requiring no much cost for wastewater disposal.

Further, it is possible to electrically connect the inner circuit pattern formed on the substrate to the outer circuit pattern on the insulation layer interposed between the inner and outer circuit patterns by using the blind hole securely, and is possible to provide the multilayer circuit board having a high parts mounting density, a high function, a high reliability and a high cost performance.

Furthermore, according to the third and fourth embodiments of the present invention, it is possible to position the signal carrying pattern below the power source pattern or the ground pattern readily, for instance, by determining the first inner circuit pattern as the signal carrying pattern and by selecting either the second inner circuit pattern or the third inner circuit pattern as the power source pattern or the ground pattern. This prevents the interference generated by the signal carrying pattern from causing adverse effect to the peripheral devices.

What is claimed is:

1. A multilayer print circuit board comprising:

a substrate being electrically insulative;

a first circuit pattern provided on at least one surface of the substrate;

an insulation layer having an inner insulation layer and an outer insulation layer laminated thereon, said insulation layer being provided on the substrate to overlay the first circuit pattern, wherein the outer insulation layer comprises a resin, calcium carbonate powder and polybutadien as a shock resistant agent, wherein said calcium carbonate powder has an average particle size of 2 to 4 μm being dispersed in the resin, a weight ratio of 15 to 35 weight parts of calcium carbonate powder to 100 weight parts of resin and wherein said polybutadien has a weight ratio of 10 to 20 weight parts of polybutadien to 100 weight parts of resin, and wherein the inner insulation layer comprises a resin;

a blind hole provided in the insulation layer so as to reach the first circuit pattern for exposing a surface of the first circuit pattern;

a second circuit pattern provided on the insulation layer or on the insulation layer and an inner wall of the blind hole so as to electrically connect the first circuit pattern to the second circuit pattern through the blind hole.

2. The multilayer print board as claimed in claim 1, wherein said blind hole has a V-letter tapered shape which forms an angle of 45° to 85° to the surface of the substrate.

3. A multilayer print circuit board comprising:
a substrate being electrically insulative;
a first circuit pattern provided on at least one surface of the substrate;
a first insulation layer having a first inner insulation layer and a first outer insulation layer laminated thereon, the first insulation layer being provided on the substrate to overlay the first circuit pattern;
a first blind hole provided in the first insulation layer so as to reach the first circuit pattern for exposing a surface of the first circuit pattern;
a second circuit pattern provided on the first insulation layer or on the first insulation layer and an inner wall of the first blind hole so as to electrically connect the first circuit pattern to the second circuit pattern through the first blind hole;
a second insulation layer having a second inner insulation layer and a second outer insulation layer laminated thereon, the second insulation layer being provided on the first insulation layer to overlay the second circuit pattern;
a second blind hole provided in the second insulation layer so as to reach the second circuit pattern for exposing a surface of the second circuit pattern;
a third blind hole provided in the second insulation layer and the first insulation layer so as to reach the first circuit pattern for exposing a surface of the first circuit pattern;
a third circuit pattern provided on the second insulation layer or the second insulation layer and an inner wall of the second blind hole so as to electrically connect the second circuit pattern to the third circuit pattern through the second blind hole and provided on the second insulation layer and an inner wall of the third blind hole so as to electrically connect the first circuit pattern to the third circuit pattern through the third blind hole; and
wherein the first outer insulation layer and the second outer insulation layer comprise a resin, calcium carbonate powder and polybutadien as a shock resistant agent, wherein said calcium carbonate powder has an average particle size of 2 to 4 μm being dispersed in the resin, a weight ratio of 15 to 35 weight parts of calcium carbonate powder to 100 weight parts of resin and wherein said polybutadien has a weight ratio of 10 to 20 weight parts of polybutadien to 100 weight parts of resin, and wherein the first inner insulation layer and the second inner insulation layer comprise a resin.

4. The multilayer print circuit board as claimed in claim 3, wherein the first blind hole, the second blind hole and the third blind hole have a V-letter tapered shape which forms an angle of 45° to 85° to the surface of the substrate.

5. A multilayer print circuit board comprising:
a substrate being electrically insulative;
a first circuit pattern provided on at least one surface of the substrate;
a first insulation layer having a first inner insulation layer and a first outer insulation layer laminated thereon, the first insulation layer being provided on the substrate to overlay the first circuit pattern;
a first blind hole provided in the first insulation layer so as to reach the first circuit pattern for exposing a surface of the first circuit pattern;
a second circuit pattern provided on the first insulation layer or on the first insulation layer and an inner wall of the first blind hole so as to electrically connect the first circuit pattern to the second circuit pattern through the first blind hole;
a second insulation layer having a second inner insulation layer and a second outer insulation layer laminated thereon, the second insulation layer being provided on the first insulation layer to overlay the second circuit pattern;
a second blind hole provided in the second insulation layer so as to reach the second circuit pattern for exposing a surface of the second circuit pattern;
a third circuit pattern provided on the second insulation layer or on the second insulation layer and an inner wall of the second blind hole so as to electrically connect the second circuit pattern to the third circuit pattern through the second blind hole;
a third insulation layer having a third inner insulation layer and a third outer insulation layer laminated thereon, the third insulation layer being provided on the second insulation layer to overlay the third circuit pattern;
a third blind hole provided in the third insulation layer so as to reach the third circuit pattern for exposing a surface of the third circuit pattern;
a fourth circuit pattern provided on the third insulation layer or on the third insulation layer and an inner wall of the third blind hole so as to electrically connect the third circuit pattern to the fourth circuit pattern through the third blind hole; and
wherein the first outer insulation layer, the second outer insulation layer and the third outer insulation layer comprise a resin, calcium carbonate powder and polybutadien as a shock resistant agent, wherein said calcium carbonate powder has an average particle size of 2 to 4 μm being dispersed in the resin, a weight ratio of 15 to 35 weight parts of calcium carbonate powder to 100 weight parts of resin and wherein said polybutadien has a weight ratio of 10 to 20 weight parts of polybutadien to 100 weight parts of resin, and wherein the first inner insulation layer, the second inner insulation layer and the third inner insulation layer comprise a resin.

6. The multilayer print circuit board as claimed in claim 5 further comprising at least one of a fourth blind hole, a fifth blind hole and a sixth blind hole;
wherein the fourth blind hole is provided in the first insulation layer, the second insulation layer and the third insulation layer so as to reach the first circuit pattern for exposing a surface of the first circuit pattern:
wherein the fifth blind hole is provided in the first insulation layer and the second insulation layer so as to reach the first circuit pattern for exposing a surface of the first circuit pattern;
wherein the sixth blind hole is provided in the second insulation layer and the third insulation layer so as to reach the second circuit pattern for exposing a surface of the second circuit pattern; and
wherein, when the fourth blind hole is present, the fourth circuit pattern is further provided on the third insulation layer or on the third insulation layer and an inner wall of the fourth blind bole so as to electrically connect the first circuit pattern to the fourth circuit pattern through the fourth blind hole, wherein, when the fifth blind hole is present, the third circuit pattern is further provided on the second insulation layer or on the second insulation layer and an inner wall of the fifth blind hole so as to electrically connect the first circuit pattern to the third circuit pattern through the fifth blind hole, and wherein, when the sixth blind hole is present, the fourth circuit pattern is further provided on the third insulation layer or on the third insulation layer and an inner wall of the sixth blind hole so as to electrically connect the second circuit pattern to the fourth circuit pattern through the sixth blind hole.

7. The multilayer print circuit board as claimed in claim 6, wherein the first blind hole, the second blind hole, the third blind hole, the fourth blind hole, the fifth blind hole and the sixth blind hole have a V-letter tapered shape which forms an angle of 45° to 85° to the surface of the substrate.

* * * * *